United States Patent
Singh et al.

(10) Patent No.: US 10,099,437 B2
(45) Date of Patent: Oct. 16, 2018

(54) FABRICATION OF DIRECTIONALLY ORIENTED BLOCK COPOLYMER FILMS

(71) Applicants: Gurpreet Singh, Akron, OH (US); Alamgir Karim, Akron, OH (US)

(72) Inventors: Gurpreet Singh, Akron, OH (US); Alamgir Karim, Akron, OH (US)

(73) Assignee: The University of Akron, Akron, OH (US)

( * ) Notice: Subject to any disclaimer, the term of this patent is extended or adjusted under 35 U.S.C. 154(b) by 204 days.

(21) Appl. No.: 14/405,844

(22) PCT Filed: Jun. 5, 2013

(86) PCT No.: PCT/US2013/044303
§ 371 (c)(1),
(2) Date: Dec. 5, 2014

(87) PCT Pub. No.: WO2013/184795
PCT Pub. Date: Dec. 12, 2013

(65) Prior Publication Data
US 2015/0298405 A1 Oct. 22, 2015

Related U.S. Application Data

(60) Provisional application No. 61/655,664, filed on Jun. 5, 2012.

(51) Int. Cl.

| | |
|---|---|
| B32B 27/28 | (2006.01) |
| B32B 7/04 | (2006.01) |
| B82Y 40/00 | (2011.01) |
| B29C 71/02 | (2006.01) |
| B29C 71/00 | (2006.01) |
| B29C 67/24 | (2006.01) |
| B81C 1/00 | (2006.01) |
| C08J 5/18 | (2006.01) |
| G03F 7/00 | (2006.01) |
| B29K 105/00 | (2006.01) |
| B29K 96/04 | (2006.01) |
| B29L 7/00 | (2006.01) |

(52) U.S. Cl.
CPC ............. *B29C 71/02* (2013.01); *B29C 67/24* (2013.01); *B29C 71/0072* (2013.01); *B81C 1/00031* (2013.01); *C08J 5/18* (2013.01); *G03F 7/0002* (2013.01); *B29C 2071/022* (2013.01); *B29K 2096/04* (2013.01); *B29K 2105/0085* (2013.01); *B29L 2007/008* (2013.01); *B81C 2201/0149* (2013.01); *C08J 2353/00* (2013.01); *C08J 2383/10* (2013.01)

(58) Field of Classification Search
CPC ..... B29C 67/24; B29C 71/0072; B29C 71/02; B29C 2071/022; B81C 1/00031; B81C 2201/0149; C08J 5/18; C08J 2353/00; C08J 2383/10; G03F 7/0002; B29K 2096/04; B29K 2105/0085; B29L 2007/008

See application file for complete search history.

(56) References Cited

U.S. PATENT DOCUMENTS

| | | |
|---|---|---|
| 8,083,953 B2 | 12/2011 | Millward et al. |
| 8,114,301 B2 | 2/2012 | Millward et al. |
| 2006/0013956 A1 | 1/2006 | Angelescu et al. |
| 2010/0178615 A1 | 7/2010 | Colburn et al. |

FOREIGN PATENT DOCUMENTS

GB 1028357 A 5/1966

OTHER PUBLICATIONS

Berry, BC et aL 'Orientational Order in Block Copolymer Films Zone Annealed below the Order-Disorder Transition Temperature.' Nano Letters 2007. vol. 7, No. 9, pp. 2789-2794; abstract; figures 1, 6; p. 2789 col. 1, paragraph 2 and col. 2, paragraph 1; p. 2790, col. 1, paragraph 2 and col. 2, paragraph 2; p. 2792, col. 2, paragraph 2.
The Engineering Toolbox, 'Coefficients of Unear Thermal Expansion' [online datasheet] Apr. 20, 2012 [retrieved Oct. 15, 2013] Retrieved from the Internet<URL http://web.archive.org/web/20120420163711/http:/twww.engineeringtoolbox.com/linear-expansion-coefficients-d_95.html>; entire webpage.

*Primary Examiner* — Irina S Zemel
*Assistant Examiner* — Jeffrey S Lenihan
(74) *Attorney, Agent, or Firm* — Renner, Kenner, Greive, Bobak, Taylor & Weber

(57) ABSTRACT

Directionally oriented block copolymer films and zone annealing processes for producing directionally oriented block films are provided. The zone annealing processes include methods of inducing horizontally oriented block copolymers through a soft sheer process and methods of inducing vertically oriented block copolymers via sharp dynamic zone annealing. The zone annealing processes are capable of both small and large scale production of directionally oriented block films. The cold zone annealing processes are also capable of being combined with graphoepitaxy methods.

12 Claims, 3 Drawing Sheets

FABRICATION OF DIRECTIONALLY ORIENTED BLOCK COPOLYMER FILMS

CROSS-REFERENCE TO RELATED APPLICATIONS

This application claims priority from U.S. provisional patent application Ser. No. 61/655,664 filed on Jun. 5, 2012, which is incorporated herein by reference in its entirety.

STATEMENT REGARDING FEDERALLY SPONSORED RESEARCH OR DEVELOPMENT

This invention was made with Government support under DMR 1006421 awarded by National Science Foundation. The Government has certain rights in the invention.

FIELD OF THE INVENTION

One or more embodiments relate to directionally oriented block copolymers and methods of producing directionally oriented block copolymers.

BACKGROUND OF THE INVENTION

Block copolymer thin films remain heavily researched by academia and industry due to their potential applications in future generations of hi-tech devices. The most exciting and sought-after block copolymer property is their self-assembly into a diversity of periodic nanostructures with sizes in the range of 5-100 nm. These periodic nanostructures have found use in a wide spectrum of applications such as nanolithography, photonics, plasmonics, sensors, storage media, membranes, drug delivery, cell culture, mesoporous carbons. The critical requirement for these applications is the fabrication of well-ordered block copolymer nanostructures that are oriented either horizontally or vertically with respect to the substrate.

After significant effort over the past decade, several techniques are now available to direct block copolymer self-assembly for highly ordered nanostructures. The present block copolymer directed self-assembly efforts are focused towards enhanced self-assembly kinetics and fabrication of high aspect-ratio nanostructures. In this regard, recently, solvent and "solvothermal" based block copolymer directed self-assembly techniques in conjunction with graphoepitaxy are shown to be effective. However, most block copolymer directed self-assembly methods are generically applicable only over small areas and batch operations. Additionally, solvent-based block copolymer directed self-assembly methods are not the most attractive since they may use hazardous solvents, require sophisticated infrastructure and are incompatible with many flexible substrates that are generally organic in composition.

The practical reality of achieving these ordered block copolymer structures with scalable continuous processing methods on flexible substrates as needed for nanomanufacturing still remains a formidable challenge. Presently, there exists a need for block copolymer directed self-assembly methods that provide large-area fabrication of highly ordered nanomaterials. Ideally, block copolymer directed self-assembly methods that provide large-area fabrication of highly ordered nanomaterials do not include the use of solvents.

SUMMARY OF THE INVENTION

A first embodiment provides a method of producing a directionally oriented block copolymer comprising supplying a template-supported block copolymer film and an annealing zone that supplies a thermal gradient of at least 20° C./mm, the template having a pattern on a face that contacts the block copolymer film; contacting the block copolymer film with a confining layer, wherein one of the block copolymer film and the confining layer has a coefficient of thermal expansion that is at least twice the coefficient of thermal expansion of the other; moving the block copolymer film and the annealing zone relative to each other, such that the block copolymer film is positioned in between the heating element and the confining layer; and moving the block copolymer film and the annealing zone relative to each other to anneal the block copolymer film with the annealing zone.

A second embodiment provides a method as in the first embodiment, where the template-supported block copolymer film is subjected to a maximum temperature lower than or equal to the order-disorder transition temperature of the block copolymer.

A third embodiment provides a method as in either the first embodiment or the second embodiment where the block copolymer has a cylindrical domain of less than 60 nm.

A forth embodiment provides a method of producing a directionally oriented block copolymer comprising supplying a block copolymer film and an annealing zone with a sharp thermal gradient; moving the block copolymer film and the annealing zone relative to each other; and annealing the block copolymer film by subjecting the block copolymer film to a maximum temperature lower or equal the order-disorder transition temperature of the block copolymer and at a temperature gradient of greater than 20° C./mm.

A fifth embodiment provides a method as in the fourth embodiment, where block copolymer film has a thickness of less than or equal to 500 nm.

A sixth embodiment provides a method as in either the fourth embodiment or the fifth embodiment where the block copolymer film is in the annealing zone for is at least 50% of the longest relaxation time of the BCP.

A seventh embodiment provides a method as in any of the fourth through sixth embodiments, where the block copolymer film is applied to a substrate.

An eighth embodiment provides a method as in any of the fourth through seventh embodiments, where the substrate is a patterned template.

A ninth embodiment provides a method as in any of the fourth through eighth embodiments, where the step of moving the block copolymer film and the annealing zone relative to each other to anneal the block copolymer film is performed in a continuous process.

A tenth embodiment provides a method as in any of the fourth through ninth embodiments, where a confining layer with is applied to contact the block copolymer film, wherein one of the block copolymer film and the confining layer has a coefficient of thermal expansion that is at least twice the coefficient of thermal expansion of the other; moving the block copolymer film and the annealing zone relative to each other An eleventh embodiment provides a method as in any of the fourth through tenth embodiments, where the annealing zone supplies a max temperature above the Tg of at least one block within the block copolymer.

A twelfth embodiment provides a method as in either the forth through eleventh embodiments, where the block copolymer has a cylindrical domain of less than 60 nm.

An thirteenth embodiment provides a method of producing a directionally oriented block copolymer comprising supplying a block copolymer film and an annealing zone;

contacting the block copolymer film with a confining layer, wherein one of the block copolymer film and the confining layer has a coefficient of thermal expansion that is at least twice the coefficient of thermal expansion of the other; moving the block copolymer film and the annealing zone relative to each other, such that the block copolymer film is positioned in between the heating element and the confining layer; and moving the block copolymer film and the annealing zone relative to each other to anneal the block copolymer film with the annealing zone.

A fourteenth embodiment provides a method as in the thirteenth embodiment, where the confining layer provides continuous contact with the block copolymer film.

A fifteenth embodiment provides a method as in the thirteenth embodiment or fourteenth embodiment, where the confining layer is in the form of a conveyor belt.

A sixteenth embodiment provides a method as in any of the thirteenth through fifteenth embodiments, where the confining layer is in the form of a roller.

A seventeenth embodiment provides a method as in any of the thirteenth through sixteenth embodiments, where the annealing zone supplies a thermal gradient of at least 20° C./mm.

An eighteenth embodiment provides a method as in any of the thirteenth through seventeenth embodiments, where the block copolymer film is applied to a substrate.

A nineteenth embodiment provides a method as in any of the thirteenth through eighteenth embodiments, where the substrate is a patterned template.

A twentieth embodiment provides a method as in any of the thirteenth through nineteenth embodiments, where the annealing zone supplies a max temperature above the Tg of at least one block within the block copolymer.

A twenty-first embodiment provides a method as in any of the thirteenth through twentieth embodiments, where the block copolymer has a cylindrical domain of less than 60 nm.

A twenty-second embodiment provides a method of producing a directionally oriented block copolymer comprising supplying a template-supported block copolymer film and an annealing zone, the template having a pattern on a face that contacts the block copolymer film; moving the template-supported block copolymer film and the annealing zone relative to each other, such that the template is positioned in between the heating element and the block copolymer film; annealing the template-supported block copolymer film with the annealing zone by subjecting the template-supported block copolymer film to a maximum temperature lower than or equal to the order-disorder transition temperature of the block copolymer.

A twenty-third embodiment provides a method as in the twenty-second embodiment, where the annealing zone supplies a thermal gradient of at least 20° C./mm.

A twenty-forth embodiment provides a method as in the twenty-second embodiment or the twenty-third embodiment, where a confining layer with is applied to contact the block copolymer film, wherein one of the block copolymer film and the confining layer has a coefficient of thermal expansion that is at least twice the coefficient of thermal expansion of the other; moving the block copolymer film and the annealing zone relative to each other A twenty-fifth embodiment provides a method as in the twenty-second embodiment through twenty-forth embodiments, where the annealing zone supplies a max temperature above the Tg of at least one block within the block copolymer.

A twenty-sixth embodiment provides a method as in the twenty-second embodiment through twenty-fifth embodiments, where the block copolymer has a cylindrical domain of less than 60 nm.

A twenty-eighth embodiment provides a directionally oriented block copolymer film comprising a substantially-vertically oriented block copolymer with a cylindrical domain of less than 60 nm.

A twenty-ninth embodiment provides a substantially-vertically oriented block copolymer of the twenty-eighth embodiment, where at least 60% of the block copolymers are vertically oriented.

DETAILED DESCRIPTION OF ILLUSTRATIVE EMBODIMENTS

Figure 1:
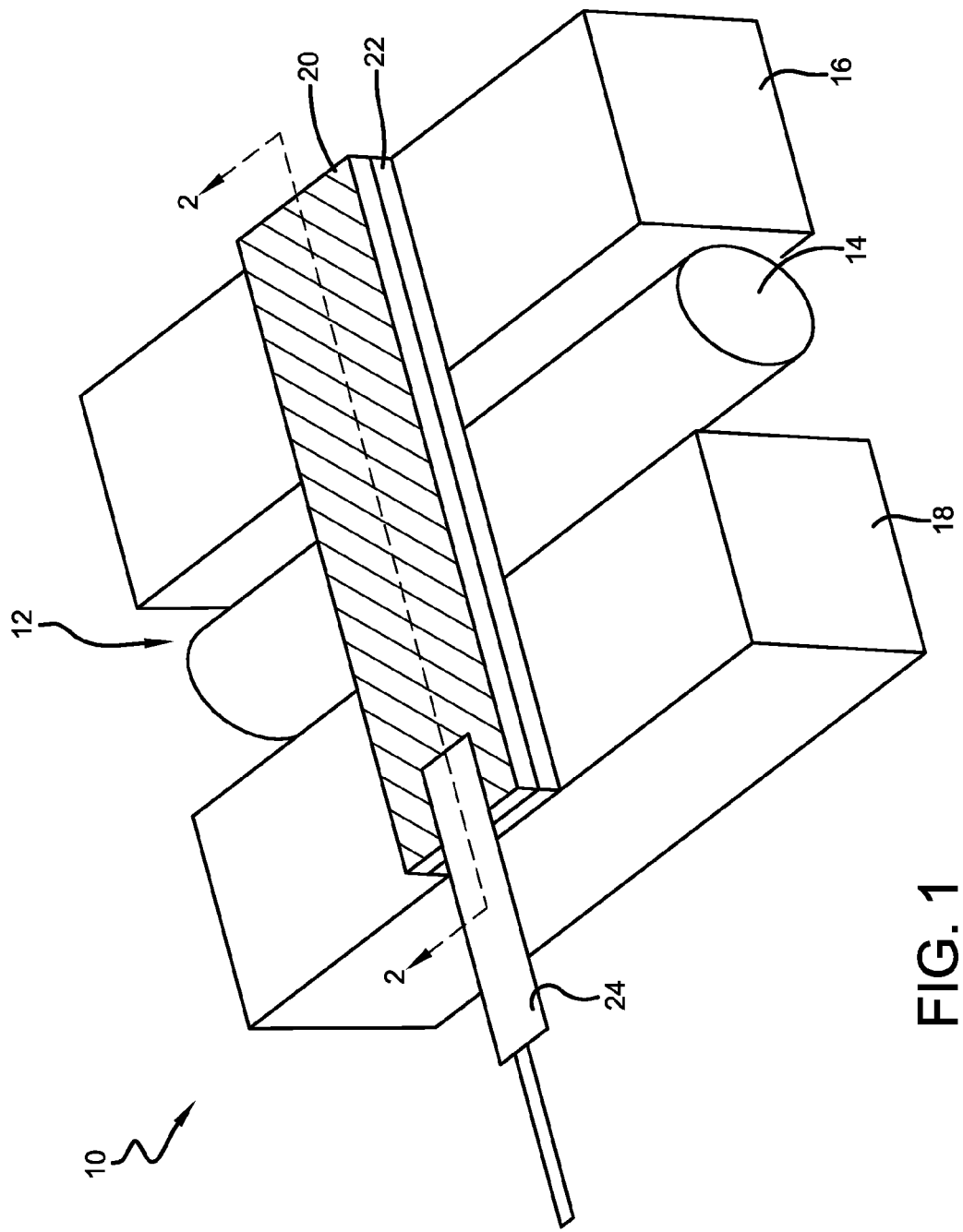
FIG. 1 provides a general schematic perspective view of a zone annealing apparatus.

This invention builds upon cold zone annealing (CZA) processes and, in one instance, hot zone annealing processes, to create block copolymer films wherein the block copolymers are directionally oriented. Directionally oriented block copolymers and the general CZA process are therefore first disclosed, and distinctive aspects of the methods of the present invention are disclosed thereafter.

Oriented block copolymers are block copolymers that have undergone phase separation to exhibit a periodic structure. Phase separation may be through a self assembly process where similar blocks segregate from dissimilar blocks resulting in a periodic structure. The self assembly of block copolymers into periodic structures may be directed by annealing. Periodic structures may include, but are not limited to, lamellae, cylinders, and gyroids. Phase separation may produce periodic structure in the nanoscale, which may be referred to as nanostructures. Nanostructures may be produced with a periodicity in the range of about 5 nm to about 100 nm. Periodicity may be measured by x-ray scattering, neutron scattering, TEM, AFM, or SEM. In one or more embodiments, oriented block copolymers may exhibit a hierarchical structure, where the periodic structure has a macroscopic pattern and nanoscopic block copolymer pattern.

Directionally oriented block copolymers may be used to produce storage media, gratings, sensors, templates, and nanoparticle super-lattices. Directionally oriented block copolymers are block copolymers wherein a substantial portion of the periodic structure of the block copolymer is aligned in the same direction. Alignment of the periodic structure of the block copolymer may be described in reference to the block copolymer film. Block copolymer films, in general, have a height (or thickness), a length, and a width, where typically the height is the shortest dimension. When the block copolymers are directionally oriented in the plane defined by the length and width, the directionally oriented block copolymer may be referred to as being horizontally oriented. When the block copolymers are directionally oriented across the plane defined by the length and width (i.e. along the direction of thickness or height), the directionally oriented block copolymer may be referred to as being vertically oriented.

Horizontal alignment of the block copolymers may be expressed in terms of Herman's orientation function. Where block polymers that are perfectly aligned in the desired direction have a Herman's orientation function value of 1, random alignment receives a value of 0, and alignment perpendicular to the desired alignment receives a value of −0.5. In one or more embodiments, substantial alignment of the block copolymer may refer those directionally oriented block copolymers with a Herman's orientation function value greater than 0.6, in other embodiments greater than 0.7, in other embodiments greater than 0.8, in other embodiments greater than 0.9, and in still other embodiments of about 1.

Vertical alignment may be characterized by the percent of vertically aligned domains defined as the area occupied by the vertical domains divided by the sum of the area occupied by the vertical domains plus the area occupied by the horizontal domains. For a percentage output, the calculation is multiplied by 100.

In one or more embodiments, substantial alignment of the block copolymer may refer those directionally oriented block copolymers with a percent of vertically aligned domains greater than 60%, in other embodiments greater than 70%, in other embodiments greater than 80%, in other embodiments greater than 90%, and in still other embodiments about 100%. The directionally oriented block copolymers are also characterized by having good long-range order, which is inversely related to grain boundaries (thus also characterized by low number of grain boundaries.

Horizontal alignment can also be characterized by the degree of angular spread. Typically, oriented nanostructures have an angular spread as high as 50 degrees to as low as 1 degree.

Zone annealing may be classified as hot zone annealing or cold zone annealing (CZA) depending on whether the maximum temperature of the temperature gradient curve is above or below the block copolymer order-disorder transition temperature (Tom). In accordance with this invention, BCPs are subjected to modified CZA processes to create directionally oriented BCPs. In a cold zone annealing process an annealing zone is used that supplies a maximum temperature to the block copolymer film lower or equal to the order-disorder transition temperature of the block copolymer.

Figure 2:
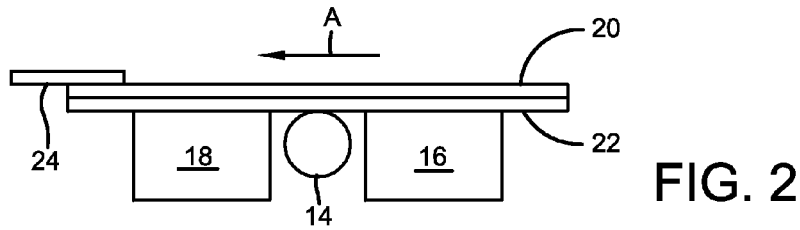
FIG. 2 is a cross section taken along the line 2-2 of FIG. 1.

A representative example of a cold zone annealing process is disclosed with reference to FIGS. 1 and 2, the CZA apparatus being generally designated by the numeral 10. The CZA apparatus 10 includes an annealing zone 12 (see FIG. 2, particularly), that is shown as consisting of a heating element 14 positioned in between a first cooling element 16 and a second cooling element 18, though it will be appreciated that the annealing zone 12 could include merely the first cooling element 16 and heating element 14. A thermal gradient is created between heating element 14 and cooling element 16, and a second thermal gradient is created between heating element 14 and cooling element 18. A block copolymer film 20 supported on a substrate 22 is moved through the annealing zone 12 (here in the direction of arrow A) by any suitable means, shown in FIG. 1 as a simple tow 24 (i.e., an assembly that pulls the substrate-supported block copolymer through the annealing zone). Any means to move the block copolymer through the annealing zone can be used. In light of the direction of travel, arrow A, the first cooling element 16 may be considered an upstream block and the second cooling element 18 may be considered a downstream block relative to the position of the heating element 14. Though the substrate-supported BCP is moved in this example, it will be appreciated that it is sufficient that the substrate-supported BCP and the elements of the annealing zone 12 move relative to each other. Block copolymer film 20 is annealed as it passes through the annealing zone 12.

In general CZA processes, the heating element or elements may be provided by any structure capable of delivering the desired temperature to the substrate-supported BCP. In some embodiments, the heating element is selected from rods, wires, coils, lasers, infrared (IR) lamps, inductive heating elements, and microwave heating elements. Though the heating element is shown as traversing the entire width of the film, it is noted that the heating element may be shaped or directed at the film so as to only cover discrete sections thereof, and can even be focused on a point. A laser would work well for point-based application of heat. In some embodiments, the heating element(s) are in the form of resistive elements providing Joule heating (or ohmic heating/resistive heating).

In general CZA processes, the cooling element or elements may be provided by any structure capable of delivering the desired temperature and thus effecting a desired temperature differential as compared to the heating element. In some embodiments, the cooling element(s) are selected from conductive elements with cooling air or liquid flowing therethrough. In some embodiments, the conductive elements are in a form selected from blocks or rollers. In other embodiments, the cooling element(s) is merely cold liquid or air or other gas flowing over the film at the appropriate location (upstream and (if applicable) downstream of the heating element).

As previously mentioned, an annealing zone includes two or more points of different temperatures, with at least a cooling element upstream of a heating element, i.e., at least on cooling element and at least one heating element. Without regard for the temperature of the surrounding atmosphere, the warmer of any two points of different temperature may be referred to as a heating point (or hot point) and the cooler of the two points may be referred to as a cooling point (or cold point). In one or more embodiments, where an annealing zone includes only two points of different temperatures it is preferred that the cooling point precedes the heating point in relation to the travel of the block copolymer film. In other words, it is preferred that a point on the block copolymer film approaches first the cooling point before the heating point.

In one or more embodiments, a multiple annealing zones may be provided in series. Although the simplest annealing zone includes an upstream cold block and a heating element, and a preferred annealing zone includes an upstream cold block followed by a heating element and then a downstream cold block, in other embodiments, multiple annealing zones are provided by alternating between cold blocks and heating elements in any desired number. For example multiple annealing zones may be provided in the following order—cold point/hot point/cold point/hot point/cold point etc.

While embodiments described with reference to FIGS. 1 and 2 include moving block copolymer film through a stationary annealing zone to directionally orient the block copolymer, embodiments may include directionally orienting a block copolymer film by providing a moving annealing zone and a stationary block copolymer film. Because one or both of the film and the block copolymer and the annealing zone may be in motion during an annealing process the motion may be described as moving the block copolymer and the annealing zone relative to each other to directionally orient the block copolymer film.

In one or more embodiments, a stationary block copolymer film may be provided and the annealing zone may move to directionally orient the block copolymer. In certain embodiments, the annealing zone may be on a track that moves along a block copolymer film to directionally orient the block copolymer. In these or other embodiments, the annealing zone may move on an x,y axis. In embodiments where the anealing zone moves on an x,y axis the path of the annealing zone may be controlled or programmed to provide a pattern of directionally oriented block copolymers.

In other embodiments, a stationary annealing zone may be provided and the block copolymer may move to directionally orient the block copolymer. In certain embodiments, the block copolymer film is pushed or pulled through an annealing zone. In these or other embodiments, the block copolymer film may be of a length that allows for movement through the annealing zone as part of continuous process. In one or more embodiments, a continuous processes may include a roll to roll process, where a roll of block copolymer film is provided, the block copolymer film is unrolled and moved through an annealing zone to directionally orient the block copolymers, and rerolled on the other end of the annealing zone. In some embodiments, a continuous process may be provided where the block copolymer film is prepared, for example by spin coating on one end of an annealing zone, moved through an annealing zone to directionally orient the block copolymers, and rolled on the other end of the annealing zone.

Although linear movements are shown and described herein, it will also be appreciated that relative movement of the annealing zone and BCP film can be achieve in rotational movement. For example, the BCP could be in the form of a disc, with relative rotational movement of the annealing zone and disc.

In one or more embodiments, the annealing zone in cold zone annealing process supplies a max temperature above the Tg of at least one block within the block copolymer. The max temperature may be considered above the Tg of at least one block within the block copolymer when it is above the Tg of a homopolymer prepared from the polymer unit of a block within the block copolymer. In one or more embodiments, the annealing zone in cold zone annealing process supplies a max temperature above the Tg of the block copolymer. In one or more embodiments, the annealing zone in cold zone annealing process supplies a max temperature above the Tg of every block within the block copolymer. In some embodiments, solvents may be present in the BCP film to decrease the Tg thereof.

The annealing zone also supplies a maximum temperature lower or equal to the order-disorder transition temperature (Tom) of the block copolymer. The order-disorder transition temperature of a block copolymer is defined by the temperature at which the periodic structure in a block copolymer disappears completely—as the temperature is raised—or by the threshold temperature at which the periodic structure begins to appear—when the temperature of a block copolymer in the homogeneous state is lowered. The order-disorder transition temperature may be determined by x-ray scattering, neutron scattering, rheology based methods measuring storage modulus or loss modulus.

As noted, the present invention provides CZA methods modified from the general state of the art summarized above in order to provide directionally oriented BCP films. The BCP films are supported on a substrate in the methods herein.

It should be noted that, although a substrate is shown in the general CZA process above and in the embodiments described herein, the present invention can be practiced without a substrate if the BCP film is self-supporting. In the processes herein, virtually any BCP may be employed so long as the Tg of at least one block thereof can be exceeded by the heating element. Other temperature limitations will be apparent from particular disclosures herein relevant to particular processes. The BCP may also include inclusions that are compatible or incompatible with the BCP. For example, the BCP may include micro- and nano-particles, surfactants, homopolymers and solvents and virtually any inclusion that does not compromise the self-assembly (directional orienting) of the BCP. These inclusions can be caught up in the directional orientation. Herein the use of BCP or "block copolymer" is to encompass block copolymers with or without inclusions.

As previously mentioned, the block copolymers are employed in the form of a film. The film may be of any desired thickness, with the understanding that the temperature experienced by film decreases as a function of distance from the heating or cooling elements. Considering the general apparatus of FIGS. 1 and 2, it should be appreciated that the heating element and (at least one) cooling element employed could be repeated at the top of the film to ensure that the temperature penetrates from both the top and bottom thereof and thus allow for thicker films to be fully affected by the annealing.

In one or more embodiments, films suitable for use in the production of directionally oriented block copolymers have a thickness of less than or equal to 10 μm. In other embodiments, films suitable for use in the production of directionally oriented block copolymers have a thickness of less than or equal to 5 μm, in other embodiments, 3 μm, in other embodiments, less than or equal to 1 μm, in other embodiments, less than or equal to 500 nm, in other embodiments, less than or equal to 250 nm, in other embodiments, less than or equal to 100 nm. There is no limit on how thin the film can be, as the temperature will easily affect very thin films.

The annealing process is not sensitive to the method of formation of the block copolymer film. Exemplary methods of forming block copolymer films include, but are not limited to, spin coating, and flow coating. In one or more embodiments, any solvents used in the process of forming a block copolymer film are removed before the annealing the block copolymer film.

In one or more embodiments, the block copolymer film may be characterized by the size of the block copolymer cylinder, which may be measured by determining the average block copolymer cylinder diameter. In one or more embodiments, the average block copolymer cylinder diameter is at least 5 nm, in other embodiments at least 10 nm, and in other embodiments at least 20 nm. In these or other embodiments, the average block copolymer cylinder diameter is at most 500 nm, in other embodiments at most 300 nm, and in other embodiments at most 100 nm. In certain embodiments, the average block copolymer cylinder diameter that is from about 5 nm to about 500 nm, in other embodiments from about 10 nm to about 300 nm, and in other embodiments from about 20 nm to about 100 nm.

Block copolymers suitable for use in a block copolymer film include any block copolymer that will self assemble to exhibit a periodic structure when annealed. These will be readily appreciated or easily determined by those of ordinary skill in the art. In one or more embodiments, the block copolymers include those polymers that include two or more blocks of different mer units.

In one or embodiments, the block copolymer may be a di-block copolymer represented by the formula: A-B, where A represents a block of repeating units and B represents a second different block of repeating units. In one or embodiments, the block copolymer may be a tri-block copolymer represented by the formula: A-B-A or A-B-C, where A represents a block of repeating units, B represents a second different block of repeating units, and C represents a third different block of repeating units. In one or embodiments, the block copolymer may be a tetra-block copolymer represented by the formula: A-B-A-B, A-B-C-A, A-B-C-B, or A-B-C-D, where A represents a block of repeating units, B represents a second different block of repeating units, and C represents a third different block of repeating units, and D represents a fourth different block of repeating units.

In one or more embodiments, the block copolymer, when the block copolymer is a diblock copolymer, the diblock copolymer may be characterized by the volume ratio of the blocks within the block copolymer, which may be measured by nuclear magnetic resonance spectroscopy. As previously discussed a diblock copolymer may be represented by the formula A-B. In one or more embodiments, the volume ratio of A to B may be from about 50 to 50 to about 90 to 10, in other embodiments from about 60 to 40 to about 80 to 20, and in other embodiments from about 70 to 30 to about 75 to 25.

Exemplary block copolymers include, but are not limited to, poly(styrene-block-methyl methacrylate), poly(styrene-block-vinyl-2-pyridine), and poly(styrene-block-dimethylsiloxane).

The annealing process is not sensitive to the method of formation of the block copolymer Suitable substrates for supporting the BCP film include those capable of supporting the desired block copolymer film and capable of withstanding the temperatures experienced during the modified CZA processes herein. In specific processes herein, the substrate is chosen for specific reasons and will be disclosed at the appropriate location below.

Exemplary substrates include quartz, mica, polydimethylsiloxane (PDMS), polyethylene terephthalate (PET), polyimides (KAPTON), glass, silicon and metals. The BCP may be deposited for support on the substrate in any known manner. Suitable methods include, but are not limited to, spin casting, blade coating, doctor blading, spray coating, electrospinning, and drop casting.

Figure 3:
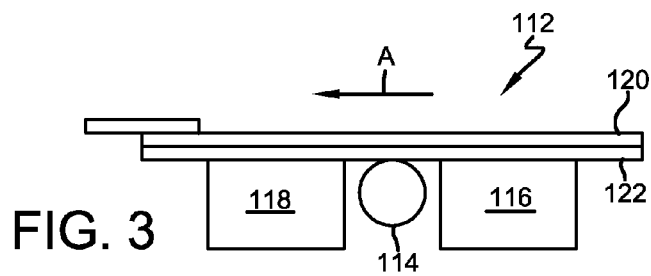
FIG. 3 is a schematic cross section as in FIG. 2, used for disclosing a sharp dynamic cold zone annealing (CZA-S) apparatus and method in accordance with this invention.

A first embodiment of this invention modifies the general CZA process to provide what is termed herein a Sharp Dynamic Cold Zone Annealing process (CZA-S). A representative example of a CZA-S process is disclosed with reference to FIG. 3, and is in many respects similar to the general CZA process, but for the temperature gradient effected at the annealing zone. In FIG. 3 a block copolymer film 120 supported on a substrate 122 is passed through an annealing zone 112 including a heating element 114 positioned in between a first cooling element 116 and a second cooling element 118. As described above with respect to the general CZA process, less or more cooling elements and heating elements can be employed, the general concept of this invention being disclosed with reference to the use of a heating element 114 positioned in between two cooling elements, one upstream and one downstream relative to the direction of travel shown by arrow A. The substrate 122 and block copolymer film 120 are typically moved through the annealing zone 14, but it is sufficient that the BCP film and the annealing zone move relative to each other, again as described above. As the block copolymer film 120 passes through the annealing zone 112 it is annealed by the heating element 114. Most particularly to this CZA-S process, the annealing is carried out with a sharp thermal gradient not practiced in the prior art, and this sharp thermal gradient produces vertically oriented cylindrical domains in the BCP film.

In accordance with this CZA-S process, directionally oriented block copolymer may be prepared by a sharp dynamic cold zone annealing comprising supplying a block copolymer film and an annealing zone with a sharp thermal gradient, moving the block copolymer film and the annealing zone relative to each other; and annealing the block copolymer film by subjecting the block copolymer film to a maximum temperature lower or equal the order-disorder transition temperature of the block copolymer and at a temperature gradient of greater than 20° C./mm.

The sharp thermal gradient is based upon the temperature experienced by the BCP film and is expressed as a change in temperature per unit length of travel of the BCP film. The change in temperature is a result of the temperature change experienced by the film as the film moves and is subjected first to the cooling element and then to the heating element. The change in temperature at a given point on the film is measured and graphed as temperature versus distance as the film moves from the cooling element to the heating element. This graph will slope upward as the film is heated, and at a near linear section thereof, the slope (rise over run) expressed at temperature/length provides the value of a thermal gradient. This thermal gradient is considered "sharp" as defined herein when it is at least 20° C./mm.

In one or more embodiments, a sharp thermal gradient is a gradient that provides a change in temperature that is at least sufficient to directionally orient a block copolymer in the vertical orientation. In one or more embodiments, a sharp thermal gradient is at least about 20° C. per mm, in other embodiments, at least about 30° C. per mm, in other embodiments, at least 40° C., in other embodiments, 45° C., in other embodiments, at least 75° C., in other embodiments, at least 100° C., and in still other embodiments at least about 150° C. per mm. It should be appreciated that the heating element temperature must be such that the temperature experienced by the BCP remains between Tg (of at least one block thereof) and the order-disorder transition temperature.

In one or more embodiments, the amount of time the block copolymer film spends in the annealing zone is at least 50% of the longest relaxation time of the BCP. In other embodiments, the amount of time the block copolymer film spends in the annealing zone is at least 30% of the longest relaxation time of the BCP, in other embodiments, at least 20%, in other embodiments, at least 10%, in other embodiments, at least 5% of the longest relaxation time. In yet other embodiments, the amount of time the block copolymer film spends in the annealing zone is equal to the longest relaxation time of the BCP. In these embodiments the rate of motion of the block copolymer film and the annealing zone relative to each other is the width of annealing zone divided by the relaxation time of the polymer. The relaxation time of the polymer may be described as the time taken to diffuse by its molecular dimensions.

The sharp thermal gradient can be produced by one or more modifications to the common annealing zone. For example, modifications alone or in combination may include but are not limited to: providing a heating element that performs at a higher temperature, using a substrate with a low coefficient of thermal expansion, using a substrate with low thermal conductivity, providing a small gap between the cooling element and heating element, and using a thin heating element.

In one or more embodiments, the substrate is chosen to have a low thermal conductivity, so as to be able to generate desired temperature gradients with the available heating/cooling system. In some embodiments, the substrate has a thermal conductivity less than or equal to 30 W/m·K (watts/meter×Kelvin), in other embodiments, less than or equal to 15 W/m·K, in other embodiments, less than or equal to 10 W/m·K, in other embodiments, less than or equal to 5 W/m·K, in other embodiments, less than or equal to 1 W/m·K, in other embodiments, less than or equal to 0.5 W/m·K, in other embodiments, less than or equal to 0.1 W/m·K, and, in other embodiments, less than or equal to 0.01 W/m·K.

In one or more embodiments, the substrate is chosen to have a low coefficient of thermal expansion. A rigid substrate with a high coefficient of thermal expansion is susceptible to breakage in presence of sharp temperature gradients. However, a flexible substrate with a high coefficient of thermal expansion is less susceptible to breakage. In embodiments where a rigid substrate used a substrate with a low coefficient is preferred. In some embodiments, the rigid substrate has a coefficient of thermal expansion less than or equal to 20/K, in other embodiments, less than or equal to 10/K, in other embodiments, less than or equal to 1 K, in other embodiments, less than or equal to 0.1/K, and in other embodiments, less than or equal to 0.01/K.

In one or more embodiments, the annealing zone in a CZA-S process providing a sharp thermal gradient includes a small gap between the cooling element and heating element. In some embodiments, the gap g1 between the first cold block 18 and the heating element 16 and the gap g2 between the second cold block and the heating element 16 are between 0.5 mm and 2 mm. In other embodiments, gaps g1 and g2 are between 0.75 mm and 1.25 mm, and in some embodiments, the gaps g1 and g2 are 1 mm. These gaps may be the same or different.

In one or more embodiments, an annealing zone that provides a sharp thermal gradient includes a heating element 114 that heats only a small area of the BCP at any given time. This will generally be controlled by the size of the heating element when the heating element provides direct heat, as in a heating wire or rod. However heating elements such as lasers would heat the surface area on which they are directed, and thus reference is made to the area of the BCP that is heated. In some embodiments, the heating element heats less than 5 mm of the BCP in the direction of travel. In other embodiments, the heating element heats less than 5 mm of the BCP in the direction of travel, in other embodiments, less than 5 mm, in other embodiments, less than 4 mm, in other embodiments, less than 3 mm, in other embodiments, less than 2 mm and, in other embodiments, less than 1 mm in the direction of travel.

In some embodiments, the heating element is a wire of less than 5 mmin in width, in other embodiments, less than 4 mm in width, in other embodiments, less than 3 mm in width, in other embodiments, less than 2 mm in width, and in yet other embodiments, less than 1 mm in width. In some embodiments, the heating element is a wire of from 0.5 to 3 mm in width. In other embodiments, the heating element is a wire of 0.75 to 1.25 mm in width and is coated with an insulating material.

The combination of gap sizes, heating element widths, temperature differentials between cooling elements and heating elements, thermal conductivity of the substrate (or lack of substrate), and rate of relative movement all combine to provide the temperature gradient experienced by the BCP film, and per the teachings herein can be altered to achieve desired sharp thermal gradients.

Advantageously, CZA-S may be used to prepare a film of directionally oriented block copolymer that is substantially oriented in the vertical direction. A substantially-vertically oriented block copolymer may be characterized by size of the cylindrical domains. In one or more embodiments, the cylindrical domains of the substantially-vertically oriented block copolymer film may be less than 60 nm, in other embodiments less than 50 nm, in other embodiments less than 40 nm, and in still other embodiments 30 nm.

Figure 4:
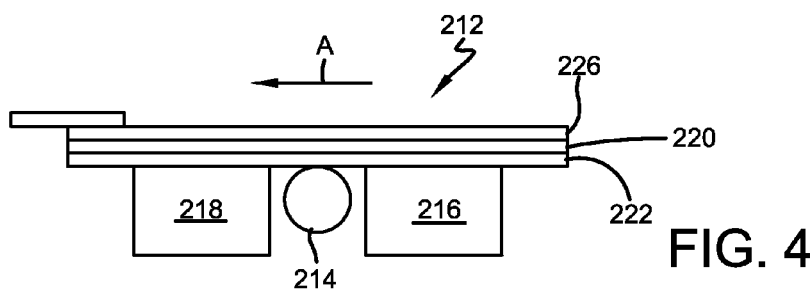
FIG. 4 is a schematic cross section, used for disclosing a cold zone annealing soft shear (CZA-SS) apparatus and method in accordance with this invention.

A second process of this invention modifies the general CZA and hot zone appealing processes to provide what is termed herein a Zone Annealing Soft Shear process (ZA-SS). A representative example of a ZA-SS process is disclosed with reference to FIG. 4, and is in many respects similar to the general hot and cold zone annealing processes, but for the employment of a confining layer 226 that interfaces with the top surface of the BCP film 220. In FIG. 4 a block copolymer film 220 supported on a substrate 222 is passed through an annealing zone 212 including a heating element 214 positioned in between a first cooling element 216 and a second cooling element 218. As described above with respect to the general CZA process, less or more cooling elements and heating elements can be employed, the general concept of this invention being disclosed with reference to the use of a heating element 214 positioned in between two cooling elements, one upstream and one downstream relative to the direction of travel shown by arrow A. The substrate 222 and block copolymer film 220 are typically moved through the annealing zone 214, but it is sufficient that the BCP film and the annealing zone move relative to each other, again as described above. As the block copolymer film 220 passes through the annealing zone 212 it is annealed by the heating element 214. Most particularly to this ZA-SS process, the temperature changes in the heating zone cause shear between the confining layer 226 and the BCP film 220, and this soft shear produces horizontally oriented cylindrical domains in the BCP film.

In accordance with this ZA-SS process, directionally oriented block copolymer may be prepared by a zone annealing soft shear process comprising supplying a block copolymer film and an annealing zone, the annealing zone having a heating element; contacting the block copolymer film with a confining layer, wherein one of the block copolymer film and the confining layer has a coefficient of thermal expansion that is at least twice the coefficient of thermal expansion of the other (i.e., the block copolymer film has a coefficient of thermal expansion that is at least twice the coefficient of thermal expansion of the confining layer, or vice versa); moving the block copolymer film and the annealing zone relative to each other, such that the block copolymer film is positioned in between the heating element and the confining layer; and annealing the block copolymer film with the heating element. In some embodiments, the film is annealed by subjecting the block copolymer film to a maximum temperature of as high as 100° C. above the ToDT of the BCP.

The confining layer is chosen as noted above such that the coefficient of thermal expansion of either of the block copolymer film and the confining layer has a coefficient of thermal expansion that is at least 1.5 times the coefficient of thermal expansion of the other. In some embodiments, one has a coefficient of thermal expansion that is at least 2 times the coefficient of thermal expansion of the other, in other embodiments, at least 5 times and, in other embodiments, at least 10 times the coefficient of thermal expansion of the other.

In some embodiments, the confining layer has a coefficient of thermal expansion that is at least twice that of the BCP film. In other embodiments, the confining layer has a coefficient of thermal expansion that is at least 1.5 times that of the BCP film, in other embodiments, at least 2 times, in other embodiments, at least 5 times, and, in other embodiments, at least 10 times that of the BCP film.

The confining layer is positioned so that at least a portion of the cross section of the BCP film that is being heated by the heating element is positioned between the heating element and the confining layer. The confining layer contacts the BCP film confromally with at least the pressure of gravity.

The difference in coefficient of thermal expansion causes different levels of directional expansion and contraction of the BCP film and confining layer in the annealing direction, expanding in the heating zone(s) and contracting in the cooling zone(s), thus setting up a single cycle of oscillatory shear. The shear facilitates unidirectional alignment of BCP films over a wide range of thicknesses and processing speeds.

In one or more embodiments, films suitable for use in the production of directionally oriented block copolymers in this method have a thickness of less than or equal to 10 µm. In other embodiments, films suitable for use in this method have a thickness of less than or equal to 5 µm, in other embodiments, 3 µm, in other embodiments, less than or equal to 1 µm, in other embodiments, less than or equal to 500 nm, in other embodiments, less than or equal to 250 nm, in other embodiments, less than or equal to 100 nm. There is no limit on how thin the film can be, as the temperature will easily affect very thin films.

In one or more embodiments, confining layers suitable for use in the production of directionally oriented block copolymers in this method have a thickness of less than or equal to 10 µm. In other embodiments, confining layers suitable for use in this method have a thickness of less than or equal to 5 µm, in other embodiments, 3 µm, in other embodiments, less than or equal to 1 µm, in other embodiments, less than or equal to 500 nm, in other embodiments, less than or equal to 250 nm, in other embodiments, less than or equal to 100 nm. There is no limit on how thin the film can be, as the temperature will easily affect very thin films.

The confining layer may be selected from silicones, polyurethanes, liquid crystal elastomers and elastomers. Silicone confining layers may be selected from polydimethylsiloxane.

Figure 5:
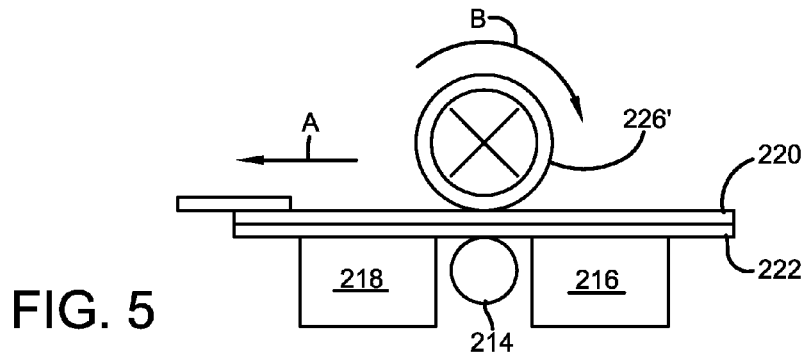
FIG. 5 is a schematic cross section, showing an alternate CZA-SS apparatus and method.

In an adaptation of this apparatus and method shown in FIG. 5, the confining layer 226' wraps the face of a roller 228, whereby the confining layer 226' is able to provide continuous contact with the block copolymer film 220 over at least a portion of the heating element 214.

Figure 6:
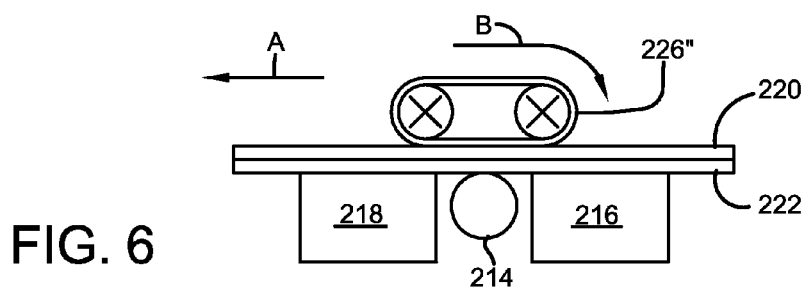
FIG. 6 is a schematic cross section, showing yet another alternate CZA-SS apparatus and method.

In another adaptation of this apparatus and method shown in FIG. 6, the confining layer 226" is in the form of a conveyor belt 230, whereby the confining layer 226" is able to provide continuous contact with the block copolymer film 220 over a more substantial surface area. This surface area may include the surface area over at least a portion of the heating element 214, and, in some embodiments at least a portion of one or more cooling elements 216, 218.

In both the roller 228 and conveyor belt 230 embodiments, the roller or conveyor belt can be free wheeling or can provide slight resistance to the movement of the BCP film 220 and substrate 222. The resistance should range between 0 to 200% of the thermally induced shear by the elastomer. The process is a dual shear method—the shear is due to the resistance and the induced shear due to thermal expansion of elastomer due to the temperature gradient. The BCP film 220 and substrate 222 are pulled in the direction of arrow A, and the roller 228 rotates in the direction of arrow B, while the conveyor belt advances in the direction of arrow C.

In one or more embodiments, the confining layer includes a pattern on the face that is in contact with the BCP film. The pattern may be formed from trenches and/or ridges formed, for example by e-beam writing, photolithography, flash imprint lithography, nanoimprint lithography and soft-lithography.

Examples of patterns that may be formed in the confining layer are not limited. In some embodiments, the patterns include but are not limited to squares, lines, circles, rectangles, triangles. The direction of pattern with respect to the ZA-SS direction can be arbitrary, user defined.

A third process of this invention modifies the general CZA process to provide what is termed herein a Templated Cold Zone Annealing process (T-CZA). A representative example of a T-CZA process is disclosed with reference to FIG. 7, and is in many respects similar to the general cold zone annealing processes, but for the employment of a substrate that bears a pattern on the face that supports the BCP film 320. This patterned substrate is herein designated as a template 322. Such templated substrates are also known as graphoepitaxial substrates. In FIG. 4 a block copolymer film 320 supported on a substrate 322 is passed through an annealing zone 312 including a heating element 314 positioned in between a first cooling element 316 and a second cooling element 318. As described above with respect to the general CZA process, less or more cooling elements and heating elements can be employed, the general concept of this invention being disclosed with reference to the use of a heating element 314 positioned in between two cooling elements, one upstream and one downstream relative to the direction of travel shown by arrow A. The substrate 322 and block copolymer film 320 are typically moved through the annealing zone 314, but it is sufficient that the BCP film and the annealing zone move relative to each other, again as described above. The template 322 is characterized by having a pattern on the face that is in contact with the BCP film 320. The pattern is represented in the cross section of FIG. 7 by a trench 330, running in the direction of travel, arrow A. As the block copolymer film 320 passes through the annealing zone 312 it is annealed by the heating element 314. Most particularly to this T-CZA process, the temperature changes in the heating zone cause the BCP film to fill the pattern and the domains directionally align in the direction of the pattern. It also results in a faster filling of the pattern within the template as compared to prior art static thermal annealing.

In accordance with this T-CZA process, directionally oriented block copolymer may be prepared by a templated cold zone annealing process comprising supplying a template-supported block copolymer film and an annealing zone, the annealing zone having a heating element and the template having a pattern on a face that contacts the block copolymer film; moving the template-supported block copolymer film and the annealing zone relative to each other, such that the template is positioned in between the heating element and the block copolymer film; annealing the template-supported block copolymer film with the heating element by subjecting the template-supported block copolymer film to a maximum temperature lower than or equal to the order-disorder transition temperature of the block copolymer.

The template is characterized by having a pattern on the face that is in contact with the BCP film. The pattern may be formed from trenches and/or ridges formed, for example by e-beam writing, photolithography, flash imprint lithography and nanoimprint lithography.

Examples of patterns that may be formed in the template include but are not limited to _squares, lines, circles, triangles, rectangles, etc.

Figure 7:
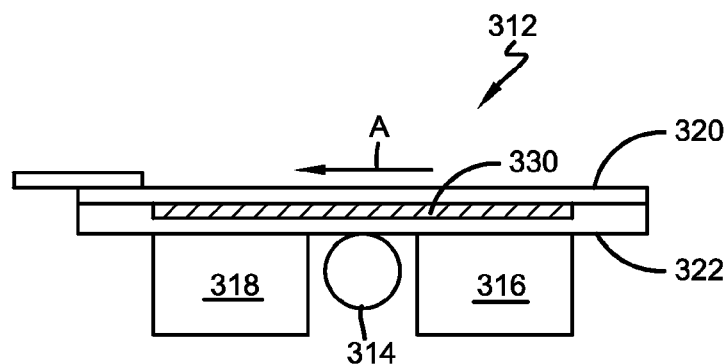
FIG. 7 is a schematic cross section as in FIG. 2, used for disclosing a templated cold zone annealing (T-CZA) apparatus and method in accordance with this invention.
Figure 8:
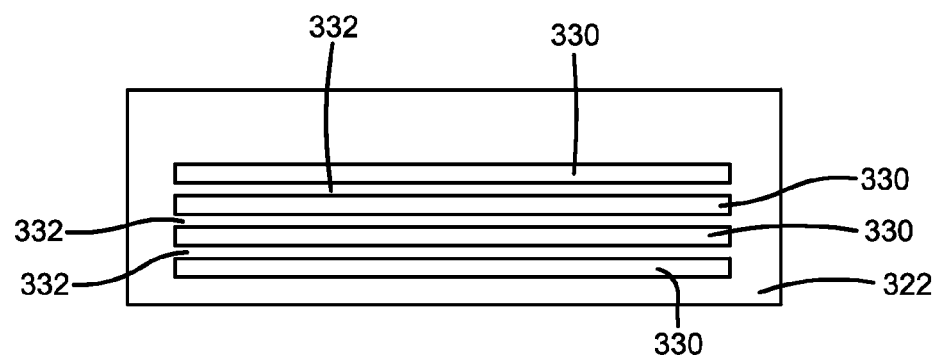
FIG. 8 is a top view of an exemplary template.
Figure 9:
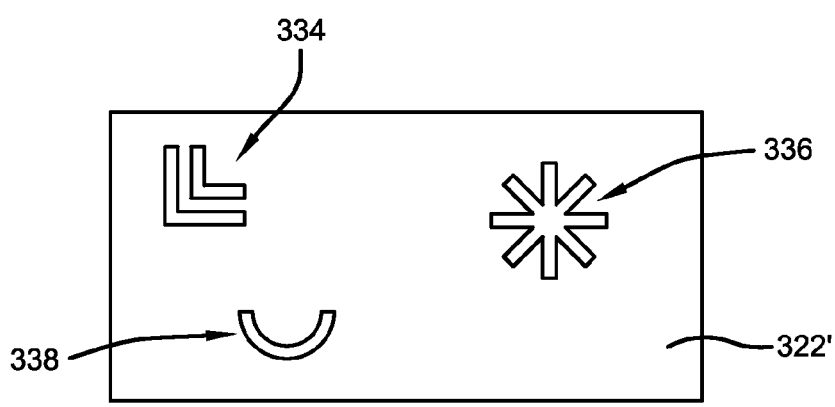
FIG. 9 is a top view of another exemplary template.

In some embodiments, the pattern is characterized by alternating trenches 330 and ridges 332 that extend in the direction of travel of the BCP film 320 and substrate 322. This is shown in FIGS. 7 and 8. In other embodiments, the pattern is characterized by more complex patterns such as at 334, 336, and 338 shown in FIG. 9 shown on template 322'.

The template may have thermal conductivities as high as 200 W/m·K. However lower thermal conductivities as those described above relative to the CZA-S process are preferred.

Directional orientation is along the pattern and CZA direction. Time required for orientation is 4× lower than that required by heating the pattern in oven.

In one or more embodiments, graphoepitaxy template may be used as a substrate in the absence of a chemically neutral surface agent. A chemically neutral surface agent may be any agent that is used in addition to the substrate that provides a surface that is neutral to both chemical blocks. An example of a neutral surface agent is a neutral wetting agent.

Any of the forgoing methods can be used in any combination. More particularly, the following combinations are possible simply by combining the teachings above—(1) a CZA-S/CZA-SS process; (2) a CZA-S/T-CZA process; (3) a CZA-SS/T-CZA process; and (4) a CZA-S/CZA-SS/T-CZA process. In these combinations the use of the soft shear method is limited to cold zone annealing as commensurate with the other processes.

In (1) above, the alignment will be horizontal except in those cases where the BCP film forms domains of 60 nm or greater, in which case the alignment will be vertical. In (2) above, the alignment will be vertical. In (3) above, the alignment will be horizontal except in those cases where the BCP film forms domains of 60 nm or greater, in which case the alignment will be vertical. In (4) above, the alignment will be horizontal except in those cases where the BCP film forms domains of 60 nm or greater, in which case the alignment will be vertical.

Combinations of CZA-SS and T-CZA are also worthy of particular disclosure. While previous graphoepitaxy annealing methods such as oven annealing produce horizontally oriented cylinders aligned in the direction the channel, surprisingly, when graphoepitaxy templates are used in conjunction with a CZA-SS process the horizontally oriented cylinders align in the direction of induced shear supplied by the CZA-SS process.

What is claimed is:

1. A method of producing a directionally oriented block copolymer comprising:

supplying a template-supported block copolymer film having a first side and a second side and an annealing zone that includes a heating element that supplies a thermal gradient of at least 20° C./mm, the template supporting the template-supported block copolymer having a pattern on a face that contacts the block copolymer film on the first side of the block copolymer film;

contacting the second side of the block copolymer film with a confining layer, wherein one of the block copolymer film and the confining layer has a coefficient of thermal expansion that is at least twice the coefficient of thermal expansion of the other; moving the block copolymer film and the annealing zone relative to each other, such that the block copolymer film is positioned in between the heating element of the annealing zone and the confining layer; and moving the block copolymer film and the annealing zone relative to each other to anneal the block copolymer film with the annealing zone.

2. The method of claim 1, where the template-supported block copolymer film is subjected to a maximum temperature lower than or equal to the order-disorder transition temperature of the block copolymer.

3. The method of claim 1, where the resultant block copolymers are directionally oriented horizontally.

4. A method of producing a directionally oriented block copolymer comprising:

supplying a block copolymer film and an annealing zone that includes a heating element;

contacting the block copolymer film with a confining layer that provides continuous contact with the block copolymer film, wherein one of the block copolymer film and the confining layer has a coefficient of thermal expansion that is at least twice the coefficient of thermal expansion of the other; and moving the block copolymer film and the annealing zone relative to each other to anneal the block copolymer film with the annealing zone, such that the block copolymer film is positioned in between the heating element of the annealing zone and the confining layer.

5. The method of claim 4, where the confining layer is in the form of a conveyor belt.

6. The method of claim 4, where the confining layer is in the form of a roller.

7. The method of claim 4, where the annealing zone supplies a thermal gradient of at least 20° C./mm.

8. The method of claim 4, where the block copolymer film is applied to a substrate, where the block copolymer film has a first side and a second side and the first side of the block copolymer film contacts the substrate and the second side of the block copolymer film contacts the confining layer.

9. The method of claim 8, where the substrate is a patterned template, where the block copolymer film has a first side and a second side and the first side of the block copolymer film contacts a pattern on a face on the template and the second side of the block copolymer film contacts the confining layer.

10. The method of claim 4, where the annealing zone supplies a max temperature above the Tg of at least one block within the block copolymer.

11. The method of claim 4, where the resultant block copolymers are directionally oriented horizontally.

12. A method of producing a directionally oriented block copolymer comprising:

supplying a block copolymer film has a first side and a second side and an annealing zone that includes a heating element;

contacting the block copolymer film with a substrate so that the first side of the block copolymer film contacts the substrate;

contacting the block copolymer film with a confining layer so that the second side of the block copolymer film contacts the confining layer, wherein one of the block copolymer film and the confining layer has a coefficient of thermal expansion that is at least twice the coefficient of thermal expansion of the other; and moving the block copolymer film and the annealing zone relative to each other to anneal the block copolymer film with the annealing zone, such that the block copolymer film is positioned in between the heating element of the annealing zone and the confining layer.

* * * * *